(12) United States Patent
Schwenke et al.

(10) Patent No.: US 9,315,148 B2
(45) Date of Patent: Apr. 19, 2016

(54) LIGHT EMISSIVE PLASTIC GLAZING

(71) Applicant: EXATEC LLC, Wixom, MI (US)

(72) Inventors: Robert Schwenke, Box Elder, SD (US); Wilfried Hedderich, Hilden (DE); Chengtao Li, Novi, MI (US); Christophe Lefaux, Suzhou (CN); Ken Foster, Brighton, MI (US)

(73) Assignee: EXATEC LLC, Wixom, MI (US)

( * ) Notice: Subject to any disclaimer, the term of this patent is extended or adjusted under 35 U.S.C. 154(b) by 81 days.

(21) Appl. No.: 14/482,180

(22) Filed: Sep. 10, 2014

(65) Prior Publication Data
US 2014/0376243 A1 Dec. 25, 2014

Related U.S. Application Data

(63) Continuation of application No. 11/317,587, filed on Dec. 23, 2005, now abandoned.

(60) Provisional application No. 60/663,237, filed on Mar. 18, 2005.

(51) Int. Cl.
*B60Q 3/02* (2006.01)
*B32B 27/08* (2006.01)
(Continued)

(52) U.S. Cl.
CPC ............ *B60Q 3/0213* (2013.01); *B32B 27/08* (2013.01); *B32B 27/30* (2013.01); *B32B 27/36* (2013.01); *B32B 27/365* (2013.01); *B60J 1/00* (2013.01); *B60Q 3/004* (2013.01); *B60Q 3/0283* (2013.01); *G02B 6/0038* (2013.01); *G02B 6/0096* (2013.01); *H01L 51/5203* (2013.01); *H01L 51/524* (2013.01); *B32B 2255/10* (2013.01);
(Continued)

(58) Field of Classification Search
CPC .......... F21Y 2105/00; F21Y 2105/001; F21Y 2105/003; F21Y 2105/005; F21Y 2105/006; F21Y 2105/008; B60Q 3/0213; B60Q 1/302; B60Q 1/268; H05B 33/22; H05B 33/28
USPC ........................................................ 362/503
See application file for complete search history.

(56) References Cited

U.S. PATENT DOCUMENTS 3,012,164 A 12/1961 Franzone et al.
4,645,970 A 2/1987 Murphy
(Continued)

FOREIGN PATENT DOCUMENTS

DE 19852593 A1 5/2000
DE 20202435 A1 6/2002
(Continued)

OTHER PUBLICATIONS

Design of Organic Electroluminescent Displays with Ultraviolet-Shielding Filters, R.H. Lee, C.Y. Huang, C-Ti Chen, Journal of Applied Polymer Science, vol. 92, 1432-1436 (2004).
(Continued)

*Primary Examiner* — Robert May
(74) *Attorney, Agent, or Firm* — Cantor Colburn LLP

(57) ABSTRACT

A window assembly having a first transparent area and a light emissive area. The panel includes a first transparent layer with an ultraviolet blocking layer and an abrasion layer. The light emissive area includes a light emissive layer that may be an organic light emitting display, an electroluminescent display, a polymer light emitting display or a light pipe configured to receive light from a light source.

20 Claims, 8 Drawing Sheets

(51) Int. Cl.
*B32B 27/30* (2006.01)
*B32B 27/36* (2006.01)
*B60J 1/00* (2006.01)
*F21V 8/00* (2006.01)
*B60Q 3/00* (2006.01)
*H01L 51/52* (2006.01)

(52) U.S. Cl.
CPC ....... *B32B 2255/20* (2013.01); *B32B 2255/205* (2013.01); *B32B 2255/26* (2013.01); *B32B 2255/28* (2013.01); *B32B 2307/202* (2013.01); *B32B 2307/412* (2013.01); *B32B 2307/42* (2013.01); *B32B 2307/422* (2013.01); *B32B 2307/554* (2013.01); *B32B 2457/206* (2013.01); *B32B 2605/006* (2013.01); *H01L 51/5209* (2013.01); *H01L 51/5237* (2013.01); *H01L 51/5281* (2013.01); *H01L 51/5284* (2013.01); *H01L 2251/5361* (2013.01)

(56) References Cited

U.S. PATENT DOCUMENTS

| | | | |
|---|---|---|---|
| 4,749,261 | A | 6/1988 | McLaughlin et al. |
| 4,750,816 | A * | 6/1988 | Ito ................ B60Q 3/0213 359/266 |
| 4,934,753 | A | 6/1990 | Gajewski |
| 5,336,965 | A | 8/1994 | Meyer et al. |
| 6,309,755 | B1 | 10/2001 | Matsco et al. |
| 6,426,125 | B1 | 7/2002 | Yang et al. |
| 6,517,226 | B1 | 2/2003 | Zimmermann et al. |
| 6,666,571 | B2 | 12/2003 | Becher et al. |
| 7,048,422 | B1 | 5/2006 | Solomon |
| 7,414,357 | B2 | 8/2008 | Reul et al. |
| 7,537,361 | B2 | 5/2009 | Jugovic et al. |
| 7,794,125 | B2 | 9/2010 | Offermann et al. |
| 2005/0001456 | A1 | 1/2005 | Bohm et al. |

FOREIGN PATENT DOCUMENTS

| | | | |
|---|---|---|---|
| DE | 10204359 | A1 | 10/2002 |
| DE | 10241820 | A1 | 3/2004 |
| DE | 10320614 | A1 | 12/2004 |
| EP | 0334799 | A2 | 9/1989 |
| EP | 1234721 | A2 | 8/2002 |
| EP | 1365458 | A1 | 11/2003 |
| GB | 2333829 | A1 | 8/1999 |
| JP | 59011934 | A | 1/1984 |
| JP | 11321304 | | 11/1999 |
| JP | 2000260572 | A | 9/2000 |
| JP | 2003019922 | A | 1/2003 |
| JP | 2003053908 | A | 2/2003 |
| JP | 2004160977 | A | 6/2004 |
| JP | 2004355961 | | 12/2004 |
| WO | 02098179 | A1 | 12/2002 |
| WO | 03084810 | A1 | 10/2003 |
| WO | 2004025749 | A2 | 3/2004 |

OTHER PUBLICATIONS

Extended European Search Report; European Application No. 10175183.2-2124; Date of Mailing: Sep. 30, 2010; 7 Pages.
German Patent No. 10204359 (A1); Date of Publication: Oct. 17, 2002; Abstract Only; 1 Page.
German Patent No. 10320614 (A1); Date of Publication: Dec. 9, 2004.
German Patent No. 19852593 (A1); Date of Publication: May 25, 2000; Abstract Only; 1 Page.
German Patent No. 20202435 (U1); Publication Date: Jun. 6, 2002; Machine Translation; 23 Pages.
International Search Report; International Application No. PCT/US2006/009585; International Filing Date: Mar. 17, 2006; Date of Mailing: Jul. 18, 2006; 6 Pages.
Japanese Patent No. 11321304 (A); Publication Date: Nov. 24, 1999; Abstract Only; 1 Page.
Japanese Patent No. 2000260572 (A); Publication Date: Sep. 22, 2000; Abstract Only; 1 Page.
Japanese Patent No. 2003019922 (A); Publication Date: Jan. 21, 2003; Abstract Only; 1 Page.
Japanese Patent No. 2003053908 (A); Publication Date: Feb. 26, 2003; Abstract Only; 1 Page.
Japanese Patent No. 2004355961 (A); Date of Publication: Dec. 16, 2004; Abstract Only; 1 Page.
Japanese Patent No. 59011934 (A); Date of Publication: Jan. 21, 1984; Abstract Only; 1 Page.
Written Opinion of the International Searching Authority; International Application No. PCT/US2006/009585; International Filing Date: Mar. 17, 2006; Date of Mailing: Jul. 18, 2006; 7 Pages.

* cited by examiner

LIGHT EMISSIVE PLASTIC GLAZING

CROSS REFERENCE TO RELATED APPLICATIONS

This application claims the benefit of U.S. provisional application entitled "LIGHT EMISSIVE PLASTIC GLAZING", application No. 60/663,237 filed on Mar. 18, 2005 and is a continuation application of U.S. application Ser. No. 11/317,587 filed on Dec. 23, 2005.

FIELD

The present invention generally relates to vehicle occupant compartment lighting systems

BACKGROUND

The occupant compartment of a vehicle, more particularly an automobile, typically uses one or more lighting system to provide general lighting to the occupant compartment of the vehicle. This lighting enhances the visibility of areas within the occupant compartment that are not provided with their own lighting, such as areas occupied by occupants and their belongings, the center console and vehicle controls. The lighting system that provides general visibility to the occupant compartment is usually placed within the compartment such that the light it produces illuminates as much of the occupant compartment as possible, while taking up the least amount of space. One such lighting system, also called a "dome light", is located near the center of the roof of the occupant compartment.

Automobiles can be equipped with transparent rectangular panels located near the center of the roof, commonly referred to as a "sunroof" or "moon roof". As stated earlier, the center location of the roof is the preferable position for the dome light. When a vehicle has a sunroof, the dome light must be moved to a less favorable location or eliminated, thus, reducing or eliminating effective general illumination of the occupant compartment.

Therefore, it is desired to provide a system which will provide adequate illumination of the occupant compartment of vehicles equipped with sunroofs.

BRIEF SUMMARY

In overcoming the drawbacks and limitations of the know technologies, a light emissive window assembly is disclosed. The assembly includes a first transparent layer and light emissive layer coupled to the first transparent layer. The first transparent layer is made from a suitable material such as polycarbonate, polymethyl methacrylate, polyester blends or glass fibers or combinations thereof. The first transparent layer may further include an ultraviolet ("UV") blocking layer and/or an abrasion layer.

The light emissive layer may be a multistack of functionalities and can be applied directly using conventional printing technologies such as inkjet, screen printing, dispensing and sputtering or any other suitable method. A more preferable manufacturer would be a multilayer film. The multilayer film may be an electroluminescent display, organic light emitting display, a polymer light emitting display, or may be a light pipe having an entry point for receiving light generated by a light source, whereby light received at the entry point will travel within the light pipe via total internal reflection.

Additionally, a second transparent layer may be coupled to the emissive layer, thereby capsulating the emissive layer between the two transparent panels. The second transparent panel is constructed similarly to the first transparent panel and may have an abrasion layer and/or a UV blocking layer. The window assembly may be made by first forming a transparent panel having one side coated with an ultraviolet blocking layer and an abrasion layer. Next, a frame is formed around a portion of the perimeter of the plastic panel, thereby defining a cavity. A light source, such as the previously mentioned emissive layer, is placed within the cavity and bonded to the first transparent panel. A second transparent panel is thereafter attached to the frame and/or the first transparent panel, thereby encapsulating the light source.

These and other aspects and advantages of the present invention will become apparent upon reading the following detailed description of the invention in combination with the accompanying drawings.

DETAILED DESCRIPTION

Figure 1:
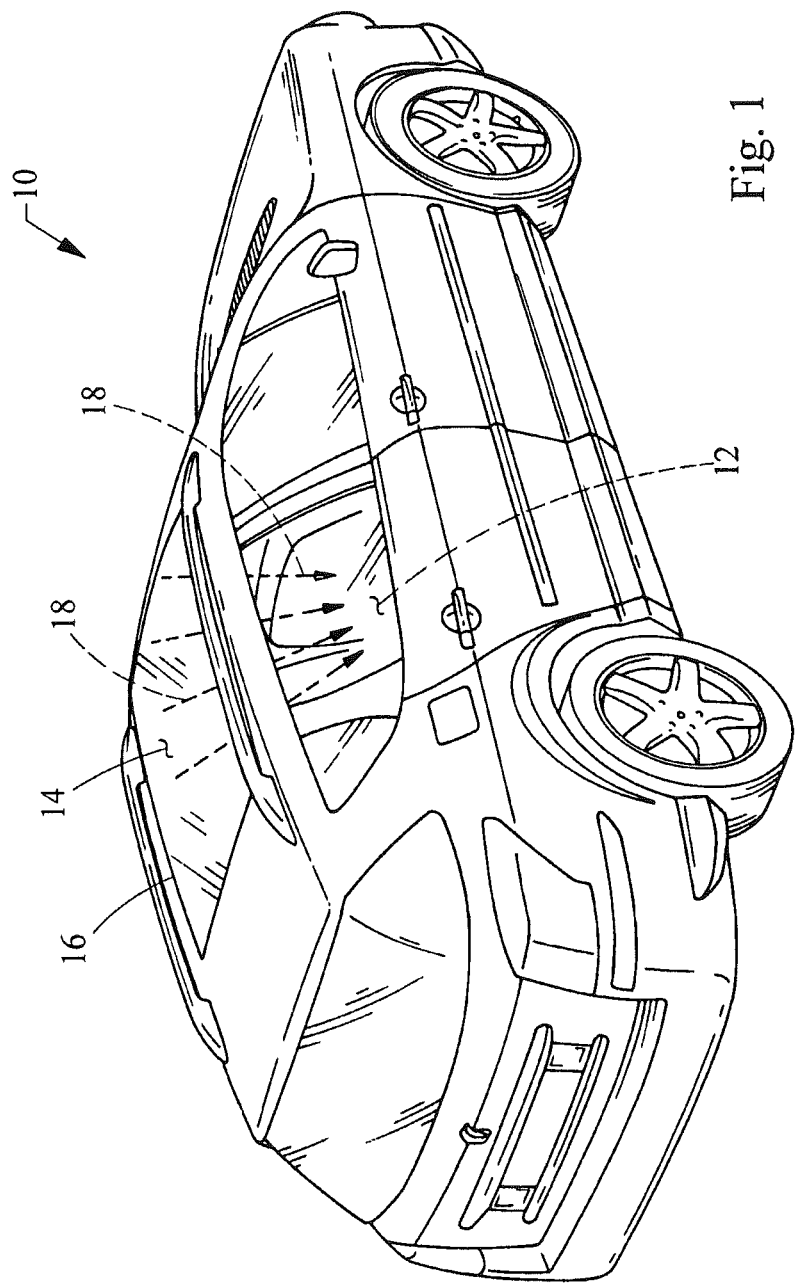
FIG. 1 is a perspective view of an automobile having a light emitting window assembly embodying the principles of the present invention.

Referring to FIG. 1, an automobile 10 incorporating the present invention is shown therein. The automobile 10 includes an occupant compartment 12 located within the interior of the automobile 10 and a window assembly 14 mounted via a frame 16 to the automobile 10. As will be fully described in the following, the window assembly 14 provides illumination to the occupant compartment 12 as indicated by the arrows referenced by the numeral 18.

Although this description describes using the panel 14 as a sunroof or moonroof to provide illumination to the occupant compartment 12 of the automobile 10, the invention is equally applicable to other areas of the automobile 10. For example, the panel 14 may be appropriately located and dimensioned to provide the lighting requirements for a headlight, taillight, turn signal, brake light, instrument panel light, reverse light or any other light commonly found on automobiles.

Figure 2:
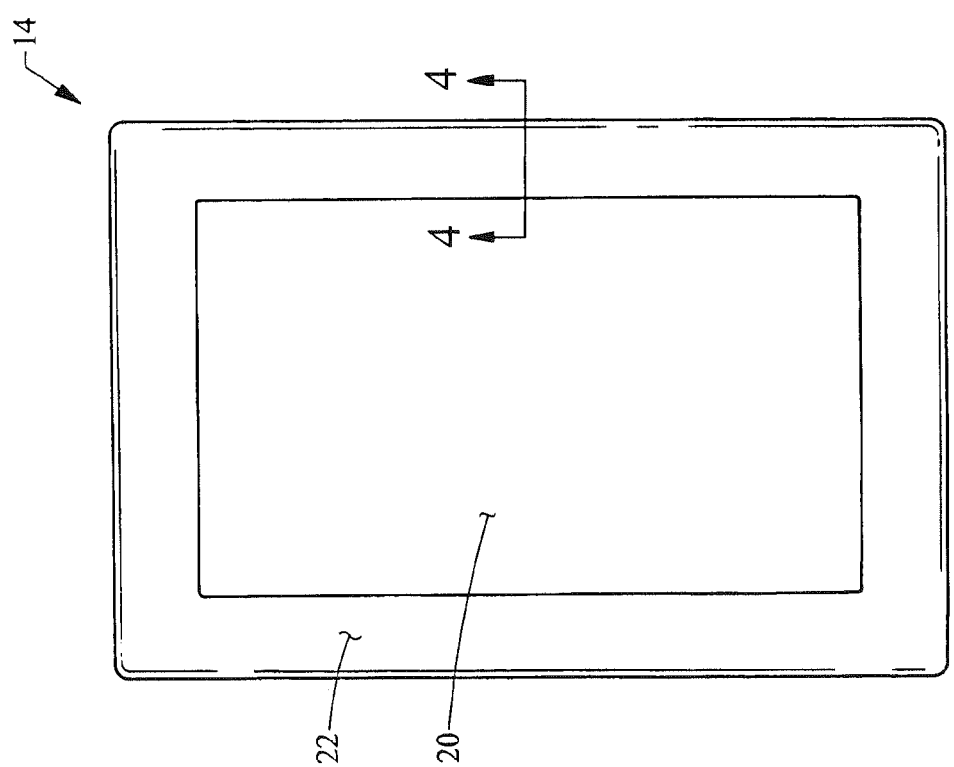
FIG. 2 is a top view of the window assembly embodying the principles of the present invention.

Referring to FIG. 2, a more detailed view of the window assembly 14 is shown. As shown therein, the window assembly 14 has a transparent viewing area 20 and an emissive area 22. The emissive area 22 is the portion of the window assembly 14 which emits light that illuminates the occupant compartment. The transparent area 20 is similar to a conventional window assembly in that the transparent area 20 does not emit light. Similar to the transparent area 20, the emissive area 22 may be transparent, but may alternatively be opaque. Also, various configurations for the layout of the emissive area 22 and transparent areas 20 can be envisioned, configurations other than a single central transparent area 20 encircled by an emissive area 22.

Figure 3:
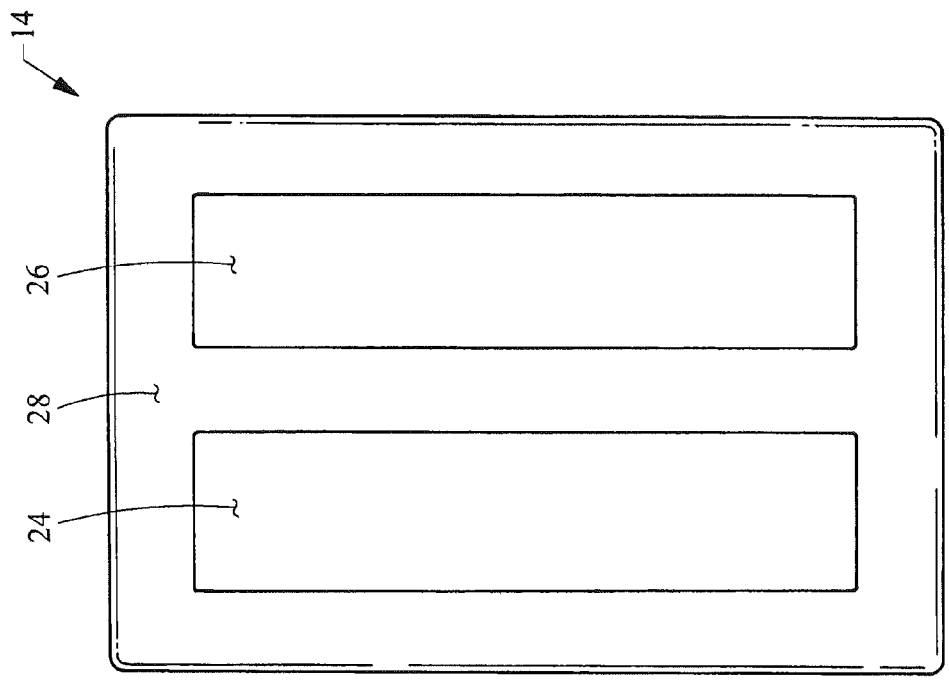
FIG. 3 is a top view of another embodiment of the window assembly embodying the principles of the present invention.

Another embodiment of the window assembly 14 is shown in FIG. 3. In this layout, the window assembly 14 has two transparent areas 24, 26 surrounded and separated by an emissive area 28. Similar to the previous embodiment, the transparent area 24 is similar to a conventional window assembly, while the emissive area 28 is capable of emitting light. Obviously, the emissive area 28 may be laid out as desired in any number of patterns.

Figure 4A:
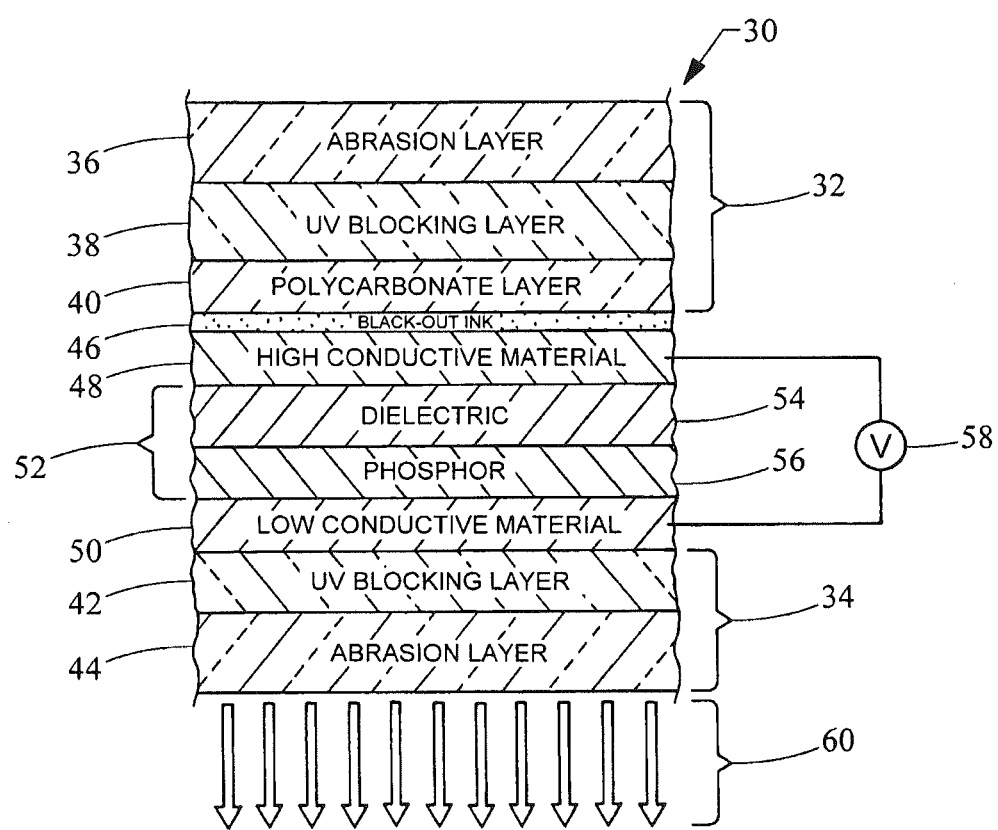
FIG. 4A is cross sectional view of a portion of the window assembly generally taken along lines 4-4 in FIG. 2.

Referring to FIG. 4A, a cross section, generally taken along lines 4-4 in FIG. 2 is shown therein. The emissive area 22 includes a first transparent panel 32 and second transparent panel 34 and between which is located the emissive element. The first transparent panel preferably includes an abrasion layer 36 and a UV blocking layer 38 provided over a base layer 40. The base layer 40 may be made of polycarbonate, polymethyl methacrylate, polyester blends, glass and glass fibers or any combination thereof. The UV blocking layer 38 may have dispersed UV absorbing additives.

The second transparent layer includes a UV blocking layer 42 and an abrasion layer 44. Similar to the first transparent panel 32, the UV blocking layer 42 of the second transparent panel 34 may have dispersed UV absorbing additives.

Coupled to the base layer 40 of the first transparent panel 32 may be a black out ink layer 46. The black out ink layer prevents any light entering the first transparent panel 32 from reaching the second transparent panel 34. Alternatively, the portion 30 may not have the black out ink layer 46.

Located between the first and second transparent panels 32, 34 is an emissive layer 52. The emissive layer 52 may be one of a variety of such light emitting structures, including, without limitation, a polymer light emitting display ("PLED"), an organic light emitting display ("OLED"), a light emitting diode ("LED") used in conjunction with a light pipe to direct light emitted by the LED to the emissive area 22 of the panel 14 or, as shown in this embodiment, an electroluminescent display ("ELD"). The emissive layer 52 includes a dielectric layer 54 and a phosphor layer 56 connected to a high conductive material the low conductive material 50, respectively.

The light emissive layer 52 can be placed onto the surface of the base layer 40 or black-out ink 46, thereby, being protected from both abrasion and UV light as this is desirable for enhancing the functioning and lifetime of the device. The light emissive layer 52 may alternatively be applied directly to the abrasive layer 36, as well as in between any existing protective layers. The light emissive layer 52 can be printed or applied by such technologies as screen printing, ink jet printing and sputtering, among others. Such printing may be performed either before or after shape forming of the window 14 or the panels 32, 34. In addition, the light emissive layer 52 can be applied a thin polymer films by any means known to those skilled in the art, with subsequent application to the base layer 40 via film insert molding ("FIM") or lamination techniques. It may be desirable to have additional transparent layers to protect the light emissive layers during the FIM process.

A voltage source 58 is connected between the high conductive material 48 and the low conductive material 50, thereby providing a current through the dielectric 54 and the phosphor 56. When a sufficient current is provided through the dielectric 54 and the phosphor 56, light, as indicated by the arrows 60 is emitted by the emissive layer 52, between the overlying portions of the high conductive material 48 and the low conductive material 58, and is passed through the UV blocking layer 42 and the abrasion layer 44 of the second transparent panel 34.

Figure 4B:
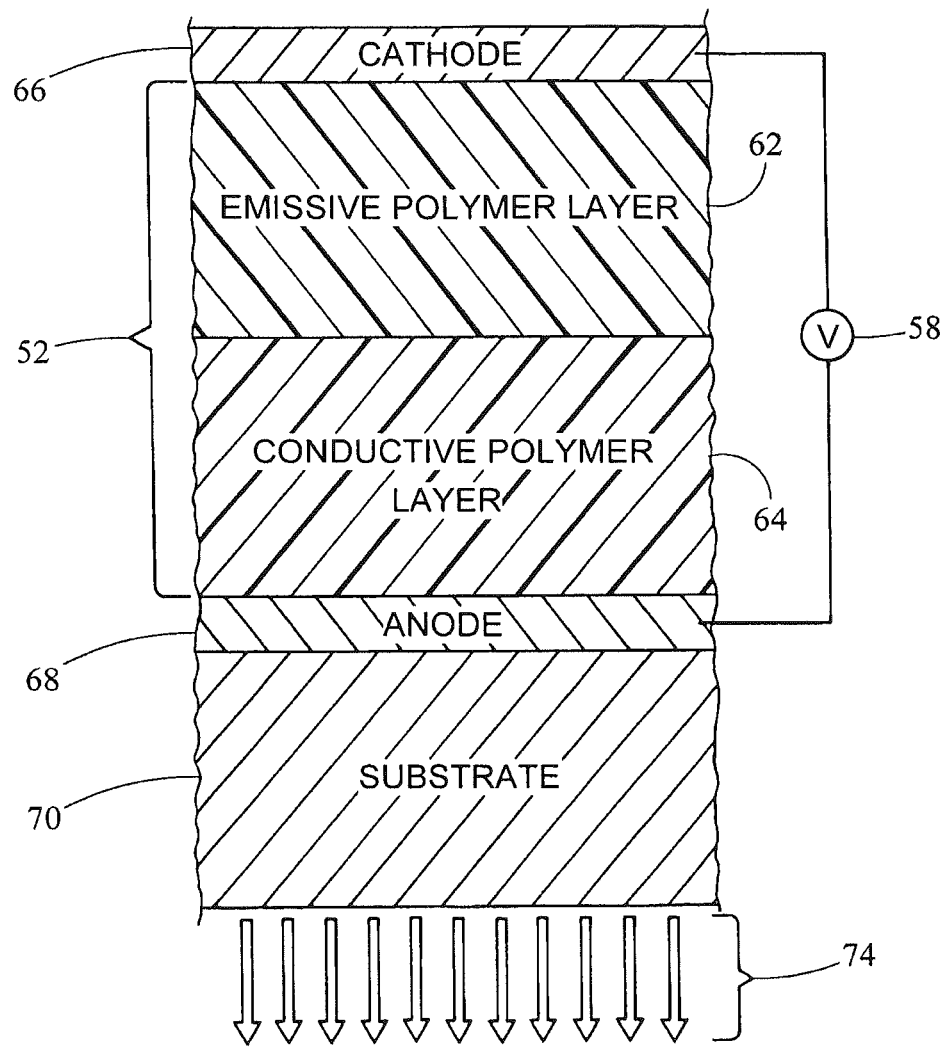
FIG. 4B is a cross sectional view similar to FIG. 4A of a window assembly using a polymer light emitting display.

Referring to the schematic representation of FIG. 4B, a PLED is used as the emissive layer 52. PLED's are typically used for backlighting and illumination, as well as the creation of displays. By definition, polymers are substances formed by a chemical reaction in which two or more molecules form into larger molecules. PLED's represent thin film displays that are created by sandwiching an undoped conjugated polymer between two proper electrodes at a very short distance.

The manufacturing of PLEDs comprises a unique deposition sequence. This sequence includes the following steps: 1) forming the structured transparent conductive oxide (e.g., indium tin oxide, etc.) anode; 2) inkjet printing the layer which will inject P-charge carriers; 3) inkjet printing of the PLED layer; 4) curing to evaporate the solvents necessary for the printing (e.g., about 98% solvents & 2% solid content); 5) deposition of the cathode by metal evaporation (Ba/Ca, then Al); and 6) encapsulation by depositing transparent layers (e.g. combination of $SiN_x$ and a scratch-resistant coating) For example, the above steps in this process cannot be performed out of sequence or in the reverse manner. Starting the steps with the cathode (Ba—Al) is not possible because barium is very sensitive to the solvents necessary for the inkjet printing of the PLED material.

The emissive layer 52 includes an emissive polymer 62 such as polyphenylene vynylene ("PPV") or polyflourene, and a conductive polymer 64 such as polydioctyl-bithiophene or polyaniline. Sandwiching the emissive polymer 62 and the conductive polymer 64 are a cathode 66 and an anode 68. To provide support, a substrate 70 is located beneath the anode 68.

As a consequence of this deposition process, the emission of light from a PLED is always in the direction that goes through the transparent substrate. This means that in order to use a PLED to illuminate a vehicle by depositing or printing the PLED directly onto a transparent plastic substrate, the PLED will need to be on the outside of the vehicle where it will be difficult to protect from environmental degradation.

Figure 4C:
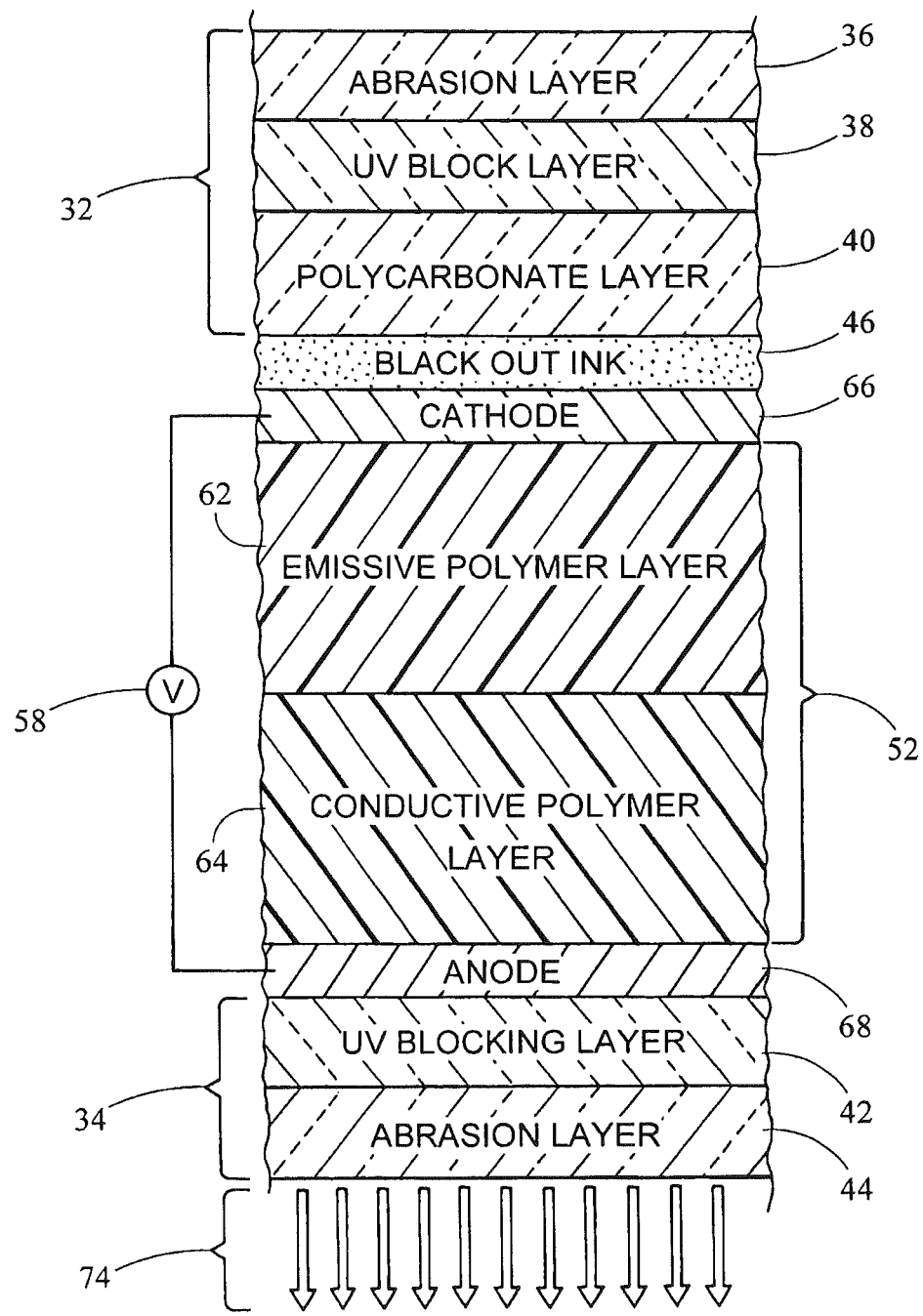
FIG. 4C is a cross sectional view similar to FIG. 4A of the window assembly of the window assembly using a polymer light emitting display as the emissive layer and a conductive ink.

In order to have the illumination projected into the vehicle, the integration of the PLED into the window/roof assembly from the inside with an adhesive is preferred and is shown in FIG. 4C. One type of adhesive system available for this type of process includes hot melt bonding.

Referring to FIG. 4C, the PLED is shown integrated into the window assembly 14. Similar to FIG. 4A, the window assembly 14 has a first and second abrasion layer 36, 44 each coupled to a first and second UV blocking layer 38, 42. Beneath the other UV blocking layer is a base layer, such as a polycarbonate panel 40. Painted onto the polycarbonate panel 40 is a black-out ink layer 46. Coupled between the black-out ink layer 46 and the second UV blocking layer 42 are the cathode 66 and anode 68, respectively. Between the cathode 66 and anode 68 is the emissive layer 52 having the emissive polymer layer 62 and the conductive polymer layer 64. The voltage source 58 provides a current through the cathode and anode 68. When a sufficient current passes through the emissive layer 52, the emissive layer 52 will produce a light indicated by the arrows referenced by numeral 74.

Figure 4D:
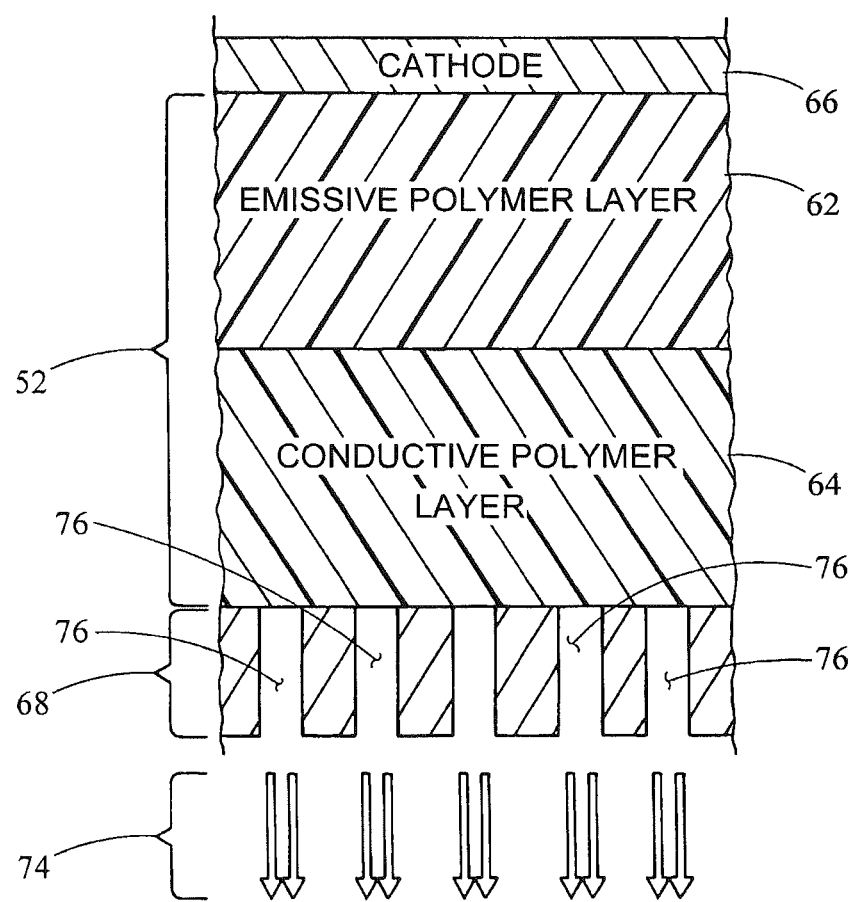
FIG. 4D is a cross sectional view of a window assembly using a PLED as the emissive layer.

In the embodiments of either FIG. 4B or 4D, when a voltage source 58 provides a sufficient current through the emissive polymer layer 62 and the conductive polymer 64 layer via the cathode 66 and anode 68, the emissive polymer layer 62 will emit light, as denoted by the arrows designated at 74.

Referring to FIG. 4D, another embodiment of a PLED light emissive layer 52 is shown. In this embodiment, the anode 68 is constructive of a metallic paste or ink, such as a silver ink sold under the trademark Paramod by Paralec Incorporated. The ink 68 is arranged in a grid pattern defining holes 76. The holes 76 allow for various degrees of illumination in areas in which the conductor is not present. The metallic paste or ink may be also utilized when using OLED's, ELD's or LED's as the emissive layer.

Figure 4E:
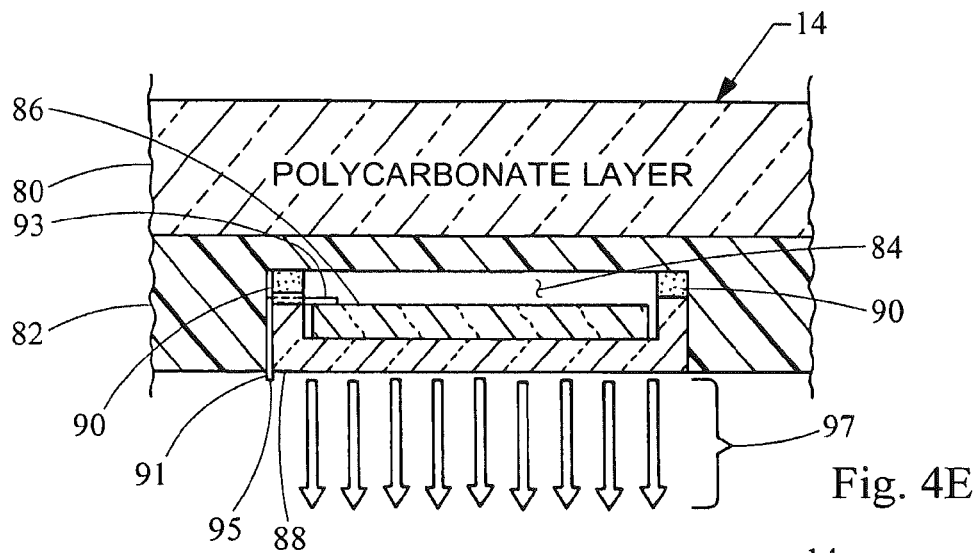
FIG. 4E is a cross sectional view similar to FIG. 4A of a window assembly made using a two shot process and embodying the principles of the present invention.

Referring to FIG. 4E, another schematic representation of the emissive area 22 of the window assembly 14 is shown. The window assembly 14 includes a base layer 80 (a polycarbonate or other material layer) as the first shot in a two component molding process. A colored frame 82 is coupled to the polycarbonate layer 14 by a second molding shot in the two component molding process. The molding of the colored frame 82 can be done in such a way as to form a recess cavity 84 in the frame. An emissive lighting system 86 such as a PLED, OLED, ELD, or LED emissive layer is therefore located within the cavity 84. To enclose the cavity and protect the emissive lighting system 86 is a polycarbonate plug 88. The polycarbonate plug may be attached to the cavity by an adhesive 90, frictional engagement or other suitable fashion, and along with the base layer 80, may be coated with an UV protection layer and an abrasion layer.

An electrical contact 91, such as a conductive wire, having a first end 93 and a second end 95 is situated between the plug 88 and the frame 82 such that the first end 93 of electrical contact 91 is in electrical communication with the emissive lighting system 86. A power supply (not shown) is connected to the second end 95 of the electrical contact. When the power supply provides a sufficient current to the lighting system 86, the lighting system 86 will emit light through the plug 88 as indicated by arrows 97.

It is possible to eliminate the additional UV protection layer. For example, the exterior of the base layer 40 may be coated with the Exatec® 900 Glazing system sold by Exatec, LLC of Michigan, and on the inside with only a "glass-like" coating deposited by plasma enhanced chemical vapour deposition ("PECVD") or other processes known to those skilled in the art. The PLED may be separately formed on a transparent polycarbonate film or substrate, which can be subsequently coated with the "glass-like" coating. The embodiment above offers the advantage that the coating process for the PLED is separate from the coating process for the window assembly 14. Moreover, the process of making the PLED can be technically and economically optimized independent of the window assembly 14 coating process.

Figure 5:
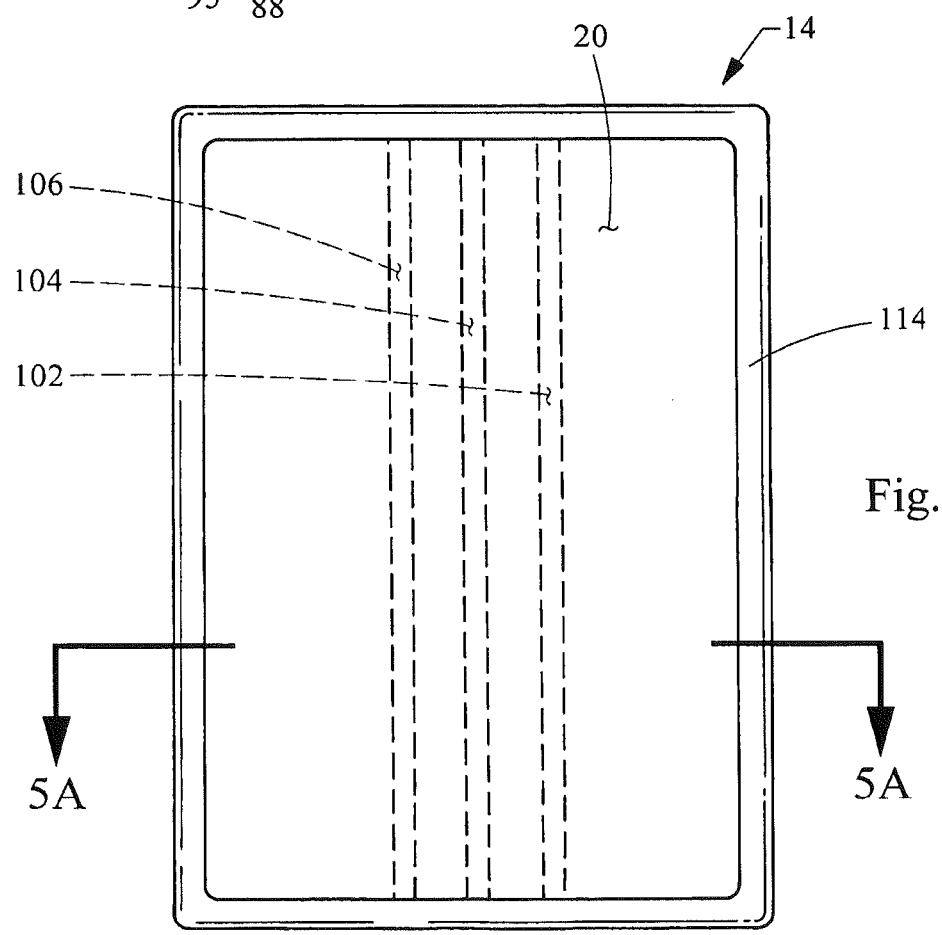
FIG. 5 is a top view of another embodiment of the window assembly embodying the principles of present invention.

Referring to FIG. 5, a more detailed view of another embodiment of the window assembly 14 is shown. As shown therein, the window assembly 14 has a transparent viewing area 20. Located within the transparent view area 20 are multiple light emissive areas 102, 104, 106. Surrounding the window assembly 14 is a frame 114. As will be explained later, the frame 114 contains one or more light sources for providing illumination to the emissive areas 102, 104, 106.

Figure 5A:
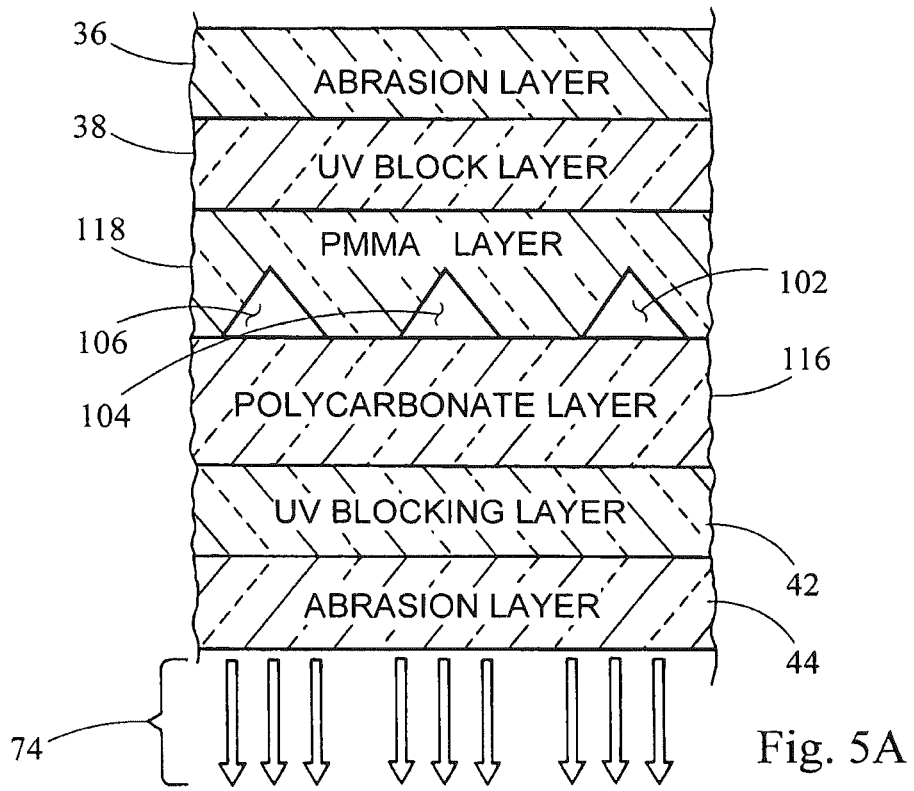
FIG. 5A is a cross sectional view of a portion of the window assembly generally taken and lines 5A-5A in FIG. 5.

Referring to FIG. 5A, a cross section, generally taken along lines 5A-5A in FIG. 5 is shown therein. The window assembly 14 includes a polycarbonate layer 116 coupled to a polymethyl methacrylate ("PMMA") layer 118. Preferably, a FIM technique is used to couple the polycarbonate layer 116 to the PMMA layer 118. Define between the PMMA layer 118 and the polycarbonate layer 116 are the emissive areas 102, 104, 106. These emissive areas are formed within the PMMA layer 118 and are enclosed by the polycarbonate layer 116 when the PMMA layer 118 is coupled to the polycarbonate layer 116. Similar to FIG. 4A, the window assembly 14 has a first and second abrasion layer 36, 44 each coupled to a first and second UV blocking layer 38, 42.

Figure 6:
FIG. 6 is a side view of the window assembly shown in FIG. 5.
Figure 6A:
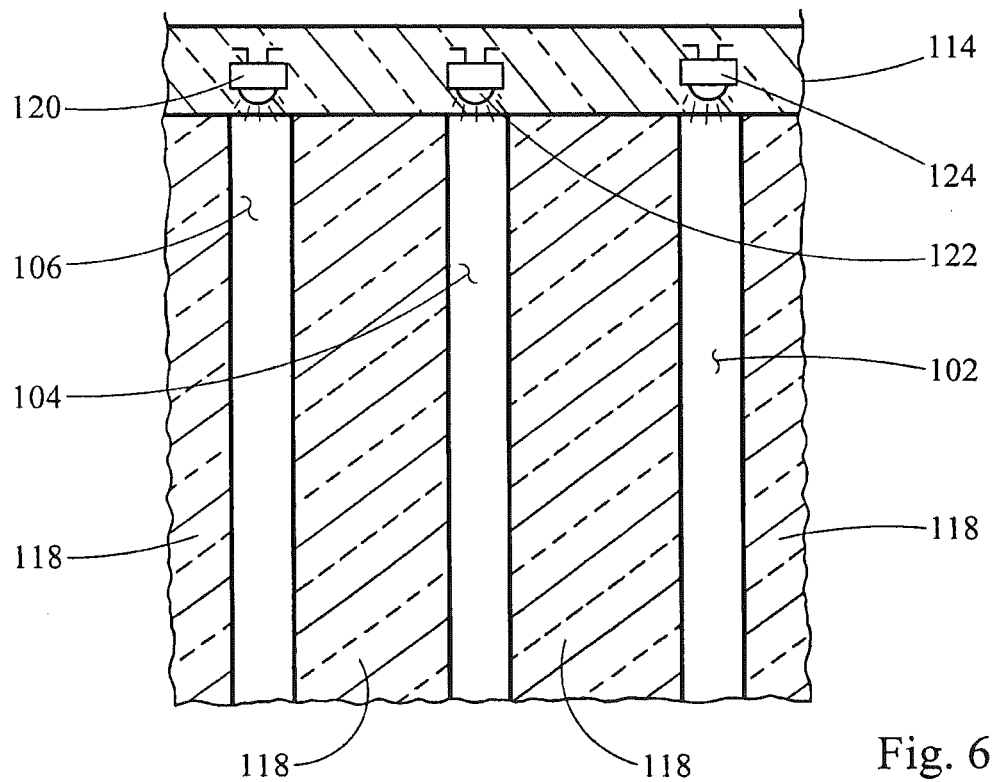
FIG. 6A is a cross sectional view of a portion of the light emissive layer generally taken along lines 6A-6A of FIG. 6.

Referring to FIGS. 6 and 6A, a side view of the window assembly 14 and a cross sectional view of the window assembly 14 generally taken along lines 6A-6A of FIG. 6 are shown. As described previously, the window assembly 14 includes light emissive areas (light pipes) 102, 104, 106. The light emissive areas 102, 104, 106 are flanked by portions of the PMMA layer 118. In this embodiment, the PMMA layer 118 could be replaced with other suitable materials. Located at end of the window assembly 14 is the frame 114. Within the frame 114 are LEDs 120, 122, 124. When activated, the LEDs 120, 122, 124, will emit light that will travel within the light emissive areas 102, 104, 106, via total internal reflection, with the exception that light traveling within the light emissive areas 102, 104, 106 will emit light through the polycarbonate layer 116, the UV blocking layer 42 and the abrasion layer 44, as denoted by the arrows designated at 74. Alternatively, any light source, such as an electroluminescent display, an organic light emitting diode and a polymer light emitting diode, may be used as light source.

Inasmuch as the foregoing disclosure is intended to enable one skilled in the pertinent art to practice the instant invention, it should not be construed to be limited thereby but should be construed to include such aforementioned obvious variations and be limited only by the spirit and scope of the following claims.

The invention claimed is:

1. A light emissive window assembly for providing illumination to an occupant compartment of an automobile comprising:

a window panel comprising a transparent viewing area and an emissive area, wherein the emissive area is configured to emit light into the occupant compartment and the transparent viewing area is not configured to emit light;

wherein the emissive area comprises a first transparent panel, wherein the first transparent panel comprises an abrasion layer with a first abrasion layer side and a second abrasion layer side, an ultraviolet blocking layer with a first UV layer side and a second UV layer side, and a base layer with a first base layer side and a second base layer side, wherein the second abrasion layer side is in contact with the first UV layer side and the second UV layer side is in contact with the first base layer side;

an emissive layer, wherein the emissive layer comprises a dielectric layer with a first dielectric layer side and a second dielectric layer side and a phosphor layer with a first phosphor layer side and a second phosphor layer side, wherein the second dielectric layer side is in contact with a first phosphor layer side;

a high conductive layer with a first high conductive layer side and a second high conductive layer side; wherein the second high conductive layer side is in contact with the first dielectric layer side;

a low conductive layer with a first low conductive layer side and a second low conductive layer side, wherein the first low conductive layer side is in contact with the second phosphor layer side; and a black out layer with a first black out layer side and a second black out layer side, wherein the first black out layer side is in contact with the second base layer side and the second blackout layer side is in contact with the first high conductive layer side.

2. The light emissive window assembly of claim 1, wherein the emissive area encircles the transparent viewing area.

3. The light emissive window assembly of claim 1, wherein the transparent viewing area comprises a first transparent area separated from a second transparent area by the emissive area which encircles both the first and second transparent areas.

4. The light emissive window assembly of claim 1, wherein the base layer comprises polycarbonate, polymethyl methacrylate, polyester blends, glass, or any combination thereof.

5. The light emissive window assembly of claim 1, wherein the base layer comprises polycarbonate.

6. The light emissive window assembly of claim 1, wherein the ultraviolet blocking layer has dispersed ultraviolet absorbing additives.

7. The light emissive window assembly of claim 1, wherein the assembly further comprises a second transparent layer located on a same side of the emissive layer as the low conductive material.

8. The light emissive window assembly of claim 7, wherein the second transparent layer comprises a second ultraviolet blocking layer with a first blocking side and a second blocking side and a second abrasion layer with a first abrasion side and a second abrasion side, wherein the first blocking side is in contact with the low conductive layer second side and the second blocking side is in contact with the first abrasion side.

9. The light emissive window assembly of claim 1, wherein the emissive layer is a polymer light emitting display, an organic light emitting display, a light emitting diode used in conjunction with a light pipe, or an electroluminescent display.

10. The light emissive window assembly of claim 1, further comprising a voltage source connected to the high conductive layer and the low conductive layer.

11. The light emissive window assembly of claim 1, wherein one or both of the high conductive layer and the low conductive layer comprises at least one of a conductive ink and a conductive wire.

12. The light emissive window assembly of claim 1, further comprising a frame coupled to the perimeter of the first transparent panel.

13. The light emissive window assembly of claim 1, wherein the light emissive area is in the form of a line located in between two transparent areas.

14. A light emissive window assembly for providing illumination to an occupant compartment of an automobile comprising:

a window panel comprising a transparent viewing area and an emissive area, wherein the emissive area is configured to emit light into the occupant compartment;

wherein the emissive area is opaque and comprises a first transparent panel, wherein the first transparent panel comprises an abrasion layer with a first abrasion layer side and a second abrasion layer side, an ultraviolet blocking layer with a first UV layer side and a second UV layer side, and a base layer with a first base layer side and a second base layer side, wherein the second abrasion layer side is in contact with the first UV layer side and the second UV layer side is in contact with the first base layer side;

an emissive layer, wherein the emissive layer comprises a dielectric layer with a first dielectric layer side and a second dielectric layer side and a phosphor layer with a first phosphor layer side and a second phosphor layer side, wherein the second dielectric layer side is in contact with a first phosphor layer side;

a high conductive layer with a first high conductive layer side and a second high conductive layer side; wherein the second high conductive layer side is in contact with the first dielectric layer side;

a low conductive layer with a first low conductive layer side and a second low conductive layer side, wherein the first low conductive layer side is in contact with the second phosphor layer side; and a black out layer with a first black out layer side and a second black out layer side, wherein the first black out layer side is in contact with the second base layer side and the second blackout layer side is in contact with the first high conductive layer side;

a second transparent layer, wherein the second transparent layer comprises a second ultraviolet blocking layer with a first blocking side and a second blocking side and a second abrasion layer with a first abrasion side and a second abrasion side, wherein the first blocking side is in contact with the second low conductive layer side and the second blocking side is in contact with the first abrasion side.

15. The light emissive window assembly of claim 14, wherein the emissive area encircles the transparent viewing area.

16. The light emissive window assembly of claim 14, wherein transparent viewing area comprises a first transparent area separated from a second transparent area by the emissive area which encircles both the first and second transparent areas.

17. The light emissive window assembly of claim 14, wherein the base layer comprises polycarbonate, polymethyl methacrylate, polyester blends, glass, or any combination thereof.

18. The light emissive window assembly of claim 14, wherein the base layer comprises polycarbonate.

19. The light emissive window assembly of claim 14, wherein the ultraviolet blocking layer has dispersed ultraviolet absorbing additives.

20. The light emissive window assembly of claim 14, further comprising a voltage source connected to the high conductive layer and the low conductive layer.

* * * * *